United States Patent
Dutton

(10) Patent No.: US 8,293,461 B2
(45) Date of Patent: Oct. 23, 2012

(54) DIRECT EMULSION PROCESS FOR MAKING PRINTED CIRCUITS

(75) Inventor: Steven Lee Dutton, Phoenix, AZ (US)

(73) Assignee: VectraOne Technologies, LLC, Phoenix, AZ (US)

(*) Notice: Subject to any disclaimer, the term of this patent is extended or adjusted under 35 U.S.C. 154(b) by 0 days.

(21) Appl. No.: 12/141,662

(22) Filed: Jun. 18, 2008

(65) Prior Publication Data

US 2009/0020314 A1 Jan. 22, 2009

Related U.S. Application Data

(63) Continuation-in-part of application No. 11/751,350, filed on May 21, 2007.

(60) Provisional application No. 60/944,715, filed on Jun. 18, 2007.

(51) Int. Cl.
G03F 7/00 (2006.01)
G03F 7/40 (2006.01)

(52) U.S. Cl. ........ 430/331; 430/311; 430/324; 430/325; 430/329; 430/330

(58) Field of Classification Search .................. 430/331, 430/311, 325, 329, 330
See application file for complete search history.

(56) References Cited

U.S. PATENT DOCUMENTS

| | | | |
|---|---|---|---|
| 3,930,963 A | | 1/1976 | Polichette et al. |
| 4,691,091 A | * | 9/1987 | Lyons et al. .............. 219/121.85 |
| 5,648,125 A | | 7/1997 | Cane |
| 6,198,525 B1 | | 3/2001 | Barringer et al. |
| 6,344,371 B2 | | 2/2002 | Fischer et al. |
| 7,524,528 B2 | * | 4/2009 | Kodas et al. .................. 427/101 |
| 2006/0165877 A1 | * | 7/2006 | Yanagimoto et al. ........... 427/58 |
| 2007/0059646 A1 | | 3/2007 | Winscom et al. |

OTHER PUBLICATIONS

International Preliminary Report on Patentability in International Application No. PCT/US2008/067384.
International Search Report and Written Opinion in International Application No. PCT/US2008/067405.

* cited by examiner

*Primary Examiner* — Amanda C. Walke
(74) *Attorney, Agent, or Firm* — Zeman-Mullen & Ford, LLP

(57) ABSTRACT

A direct emulsion process for making printed circuits and printed circuit boards which includes coating a non-metallized substrate with a solution which creates a light sensitive surface on the substrate, imaging the coated substrate with a circuit design, developing the imaged substrate, and directly plating the developed image onto the coated substrate. Coating solutions which work particularly well in this process include a ferric oxalate and palladium emulsion or a silver based emulsion.

8 Claims, 5 Drawing Sheets

DIRECT EMULSION PROCESS FOR MAKING PRINTED CIRCUITS

CROSS-REFERENCE TO RELATED APPLICATIONS

This patent application is a continuation-in-part of patent application having Ser. No. 11/751,350, filed May 21, 2007, and also claims priority to U.S. provisional patent application having Ser. No. 60/944,715 filed Jun. 18, 2007, both of which are herein incorporated in their entireties.

FIELD OF INVENTION

The present invention relates to a printed circuit board technology and more particularly to a direct emulsion process for making printed circuits which includes coating a non-metallized substrate with a solution which creates a light sensitive surface on the substrate, imaging the coated substrate with a circuit design, developing the imaged substrate, and directly plating the developed image onto the coated substrate. The present invention also relates to printed circuits and printed circuit boards which result from this method.

BACKGROUND OF THE INVENTION

Prior art processes for making printed circuits and printed circuit boards typically use a silver halide polyester based film to create an image of a desired printed circuit along with several other steps and processes for forming and developing the printed circuit. A photo plotter is a piece of equipment that typically uses silver halide polyester film as the medium for imaging the design of a circuit. This equipment is then used in subsequent processing to image circuits for metallization or to print and etch specifically designed circuits. This is known as a print and etch process or a plate and etch process.

One example of a prior art process for forming printed circuit boards includes the steps of creating a CAD/CAM design, sending data relating to the design to a photo plotter, photo plotting to a silver halide polyester film, developing an image from the sent data, creating intermediate tools, scrubbing or cleaning substrate for imaging, coating the substrate with a dry film, imaging the substrate with the design, developing the image, etching the image, and then stripping the remaining dry film. This prior art process requires several steps and has limitations on the imaging, developing, and etching of fine line images. With this process, fine line imaging can be consistently performed down to 0.003 inches. Imaging of much finer lines, for example imaging fine lines down to 0.0025 inches, creates a problem and is inconsistent when using this prior art process. In addition, laminate must be purchased with copper adhered to a panel and this type of processing has inherent issues with undercutting and rough edges which can create "lossy" issues for high speed RF applications. In other words, with this process, any rough protrusions or undercutting act like small antennas and the signal travel speed is reduced or lost during high frequency applications. High frequency applications require smooth images and very thin copper.

Accordingly, there is a need for a new method for making printed circuits and printed circuit boards which facilitates fine line imaging without the inherent problem seen in the prior art processes. In addition, a method for making printed circuits and printed circuit boards is needed which will eliminate many of the steps used in prior art processes while still enabling the creation of printed circuits and printed circuit boards with fine line imaging, with very flat non-rough surfaces without undercut utilizing very thin copper, below 2 microns.

SUMMARY OF THE INVENTION

The present invention is directed to a method for making printed circuits and printed circuit boards which eliminates the need for silver film used in imaging dry film in prior art processes. The method for making printed circuits and printed circuit boards in the present invention includes the steps of coating a non-metallized substrate with a solution which creates a light sensitive surface on the substrate, imaging the coated substrate with a circuit design, developing the images substrate, and directly plating the developed image onto the coated substrate. The imaged substrate is developed and processed to create a resulting printed circuit without the need for additional printing of dry film, developing of dry film and etching processes.

In one exemplary embodiment, the step of coating a non-metallized substrate includes coating the non-metallized substrate with a ferric oxalate and palladium emulsion. In another exemplary embodiment, the step of coating a non-metallized substrate includes coating the non-metallized substrate with a silver based emulsion.

The non-metallized substrate may be a liquid crystal polymer, a polyimide, a ceramic, a ceramic filled, a glass, a filled polytetrafluoroethylene, an unfilled polytetrafluoroethylene, a polytetrafluoroethylene woven glass, and a polytetrafluoroethylene non woven glass which is coated and an image of the desired circuit is then plated directly onto the coated substrate. The step of imaging the coated substrate may include exposing the surface of the coated substrate to at least one of an ultraviolet light, a laser photo plotter, direct collimation imaging, and laser direct imaging.

The present invention is also directed to a printed circuit that is made in accordance with the above-described method where the printed circuit includes fine line images down to 2 microns, and in particular fine line images down to 2 microns with very thin copper.

Still Another exemplary method of the present invention for making printed circuits and printed circuit boards includes the step of beginning with a metal clad substrate and removing the metal form the metal clad substrate prior to the step of coating the non-metallized substrate with a solution which creates a light sensitive surface on the substrate. The previously described non-metallized substrates may be used with this exemplary method and the solution used to coat the non-metallized substrate may include, but is not limited to, a silver nitrate based liquid, a silver chloride based with citric acid and a photosensitive gelatin, an iron based material, a chrome copper based material, a chrome nickel based material, an immersion gold material, and a platinum based material used in conjunction with palladium. It has also been shown that a ferric oxalate and palladium emulsion works particularly well as the solution used to coat the non-metallized substrate.

The present invention is also directed to a system for making a printed circuit which includes a first solution which increases a light sensitive surface when coated on a non-metallized substrate, a light source for imaging the coated substrate, one or more chemistries for developing the imaged substrate, and a second solution for plating the developed image onto the substrate. The first solution is preferably a ferric oxalate and palladium emulsion or a silver based emulsion but may also include a number of other solutions including, but not limited to, a silver nitrate based liquid, a silver chloride based with citric acid and a photosensitive gelatin, an iron based material, a chrome copper based material, a chrome nickel based material, an immersion gold material, and a platinum based material used in conjunction with palladium.

BRIEF DESCRIPTION OF THE DRAWINGS

The present invention will hereinafter be described in conjunction with the appended drawing figures, wherein like numerals denote like elements, and.

DETAILED DESCRIPTION OF EXEMPLARY EMBODIMENTS

Methods of the present invention for fabricating printed circuits and printed circuit boards generally include providing a non-metallized substrate, coating the non-metallized substrate, and imaging of a circuit design directly onto the coated substrate. The imaged substrate may then be developed with one or more chemistries and processed by subjecting it to an electroless solution in order to create a printed circuit or printed circuit board having a metal image. It should be understood by those skilled in the art that any type of non-metallized substrate may be used as long as the substrate is uniform for imaging. In addition, those skilled in the art will understand that a number of photosensitive chemicals may be used to coat the surface of the non-metallized substrate and that a variety of chemistries may be used to develop the imaged substrate.

Figure 1:
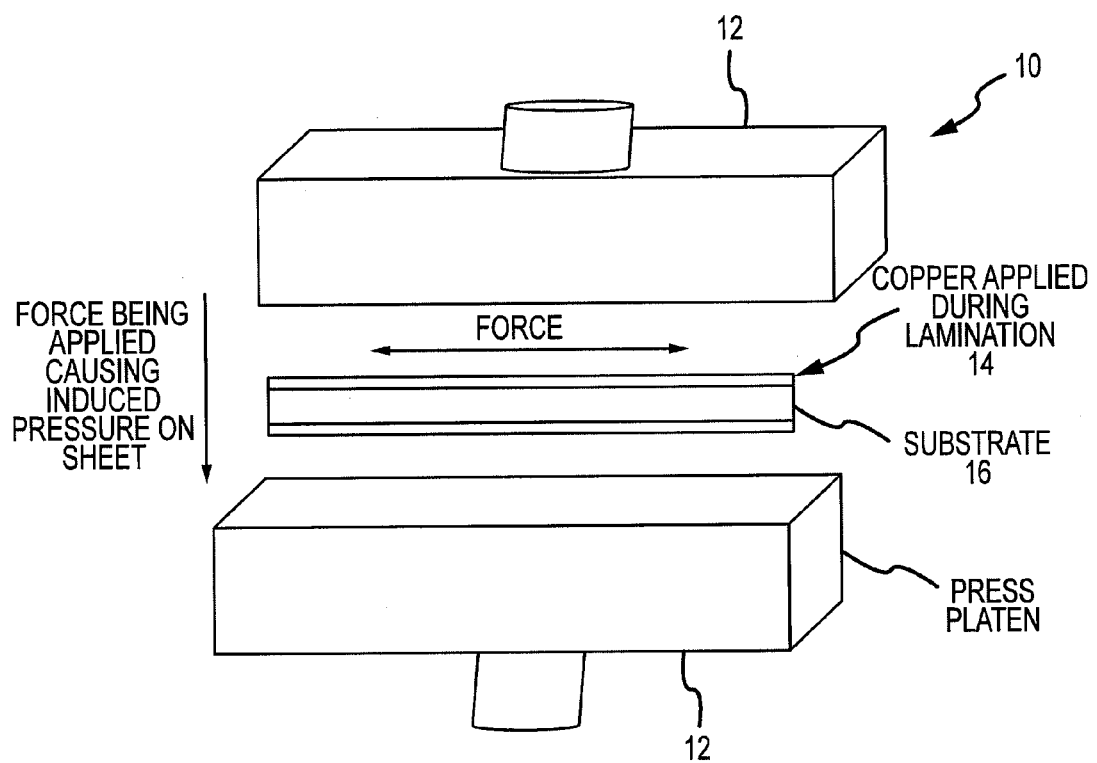
FIG. 1 is a schematic showing the prior art conventional process for laminating copper to a substrate.

FIG. 1 is a schematic showing the prior art conventional process 10 for laminating copper to a substrate. A large lamination press 12 is used to laminate copper 14 to a substrate 16 thereby creating or inducing stress into the material during the lamination cycle. This laminated material contracts or shrinks as it is exposed to heat during conventional printed circuit board processes. The shrinking of the laminated material is unpredictable over the size of the panel or sheet of laminated material. Therefore, a process or method for making printed circuit boards which does not require the use of an initial metal laminated substrate is preferable.

Figure 2:
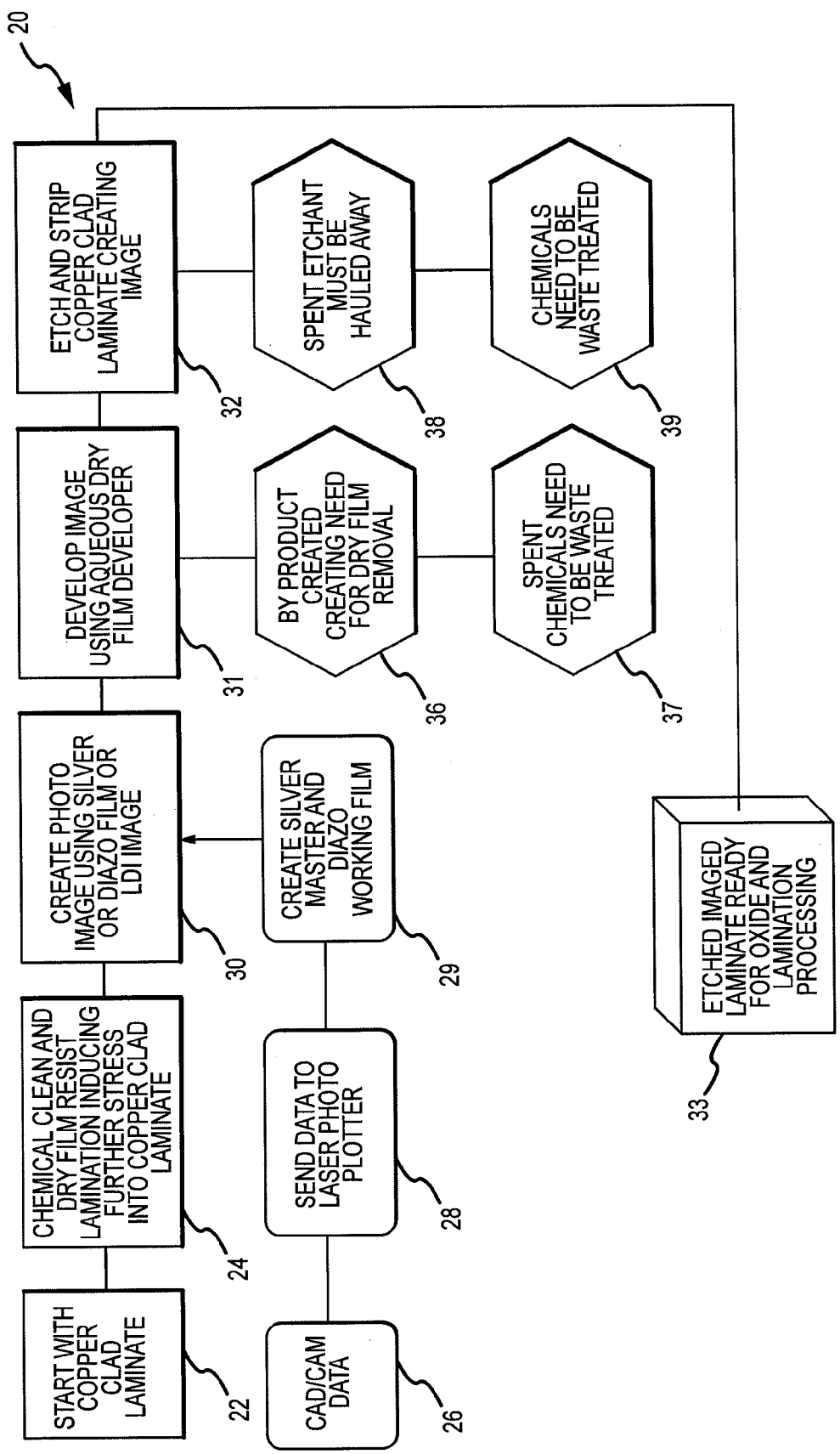
FIG. 2 is a flow chart depicting a prior art process for making printed circuits and printed circuit boards.

FIG. 2 shows a flow chart 20 which depicts an exemplary prior art process for forming printed circuits and printed circuit boards. The method begins with a copper clad laminate material in step 22 which is then chemically cleaned and laminated with a dry film resist in step 24. The chemical cleaning and dry film resist lamination induce further stress into the copper clad laminate. A circuit is created with a CAD/CAM design in step 26 and the data relating to the circuit design is sent to a laser photo plotter in step 28. Next, in step 29, the circuit design is photo plotted to a silver master and diazo working film such as, for example, a silver halide polyester film. A photo image of the circuit is created on the copper clad laminate with a dry film resist in step 30 using the silver and diazo film or laser direct imaging of the circuit design. Following imaging of the circuit design on the copper clad laminate, the image of the circuit design is developed in step 31 using an aqueous dry film developer. After the image is developed on the copper clad laminate in step 31, the copper clad laminate is etched and stripped in step 32 to create a metal image of the circuit design. The etched imaged laminate is then ready for oxide and lamination processing in step 33 to create a printed circuit.

Developing the imaged circuit on the copper clad laminate using aqueous dry film developer in step 31 creates a by product 36 which must be removed from the process. Spent chemicals 37 from step 31 also need to be waste treated thereby resulting in increased costs and increased process times for making printed circuits. In addition, spent etchant 38 resulting from etching and stripping the copper clad laminate in step 32 must be hauled away and chemicals 39 spent from this step must also be waste treated. These too add to the increased costs and increased process times for making printed circuits. Furthermore, the etching or subtractive process in step 32 allows for undercut and the inability to reach the line width and feature technology required for some applications. Features typically need to get down to less than 25 microns which is difficult to repeat using the subtractive process. Also, all layers in a printed circuit need to be registered from top to bottom and this is difficult to do with conventional prior art printed circuit board processing due to all of the stress placed in the laminate during the dry film imaging in step 31 and the etching process in step 32.

Figure 3:
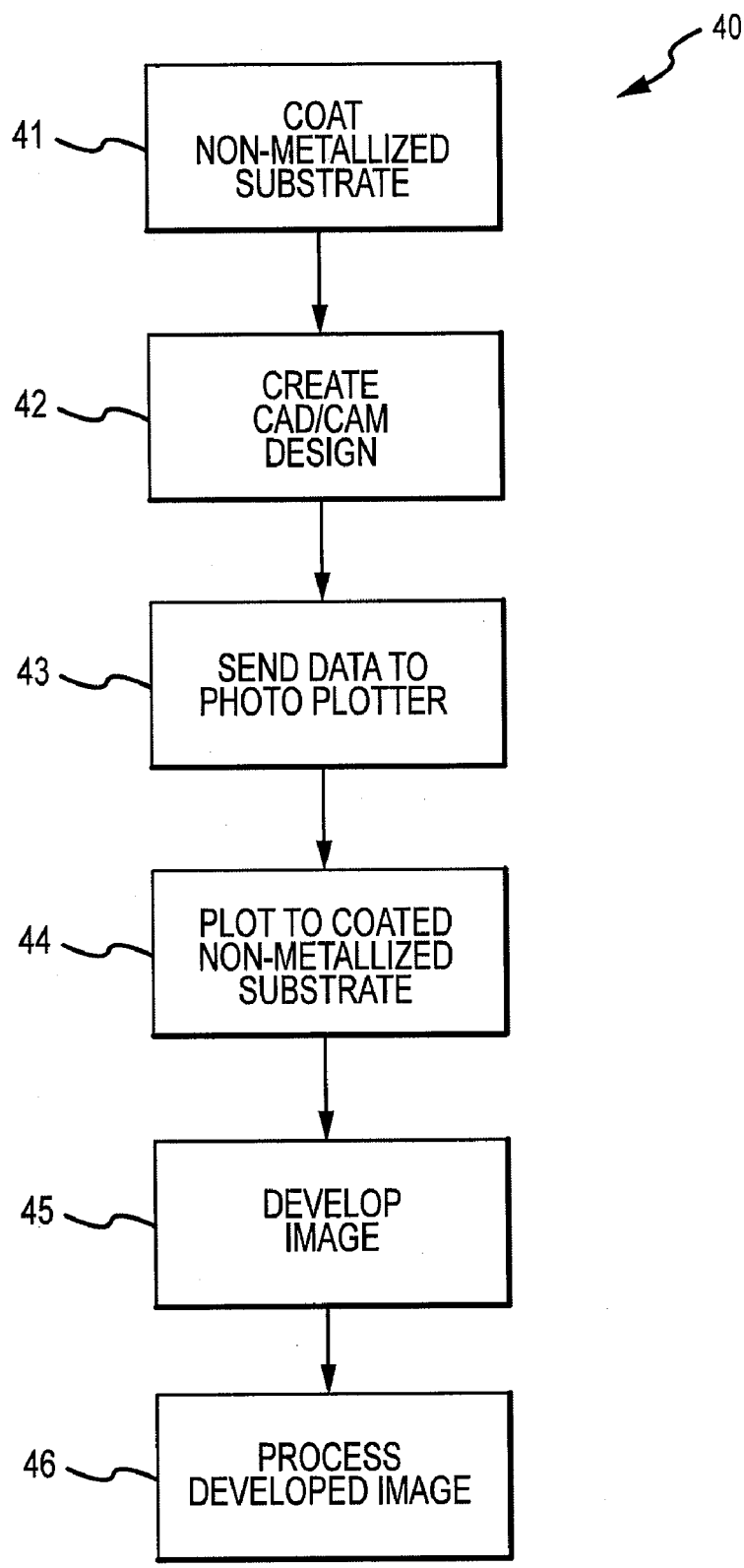
FIG. 3 is a flow chart depicting an exemplary embodiment of the method of the present invention for fabricating printed circuits and printed circuit boards.

Turning now to FIG. 3, a flow chart 40 is shown which depicts an exemplary embodiment of the method of the present invention for fabricating a printed circuit or printed circuit board. First, a non-metallized substrate is coated in step 41. Then, in step 42, a circuit design is created. The data relating to the circuit design is then sent to a photo plotter or direct imaging equipment in step 43 and the image relating to the circuit design is directly plotted on the coated non-metallized substrate in step 44. Unlike prior art processes, the image is not plotted to an intermediate silver halide polyester film or diazo. The plotted or direct image of the circuit design is then developed in step 45 and the developed image is then processed in step 46 without the need for intermediate developing and etching processes.

Figure 4:
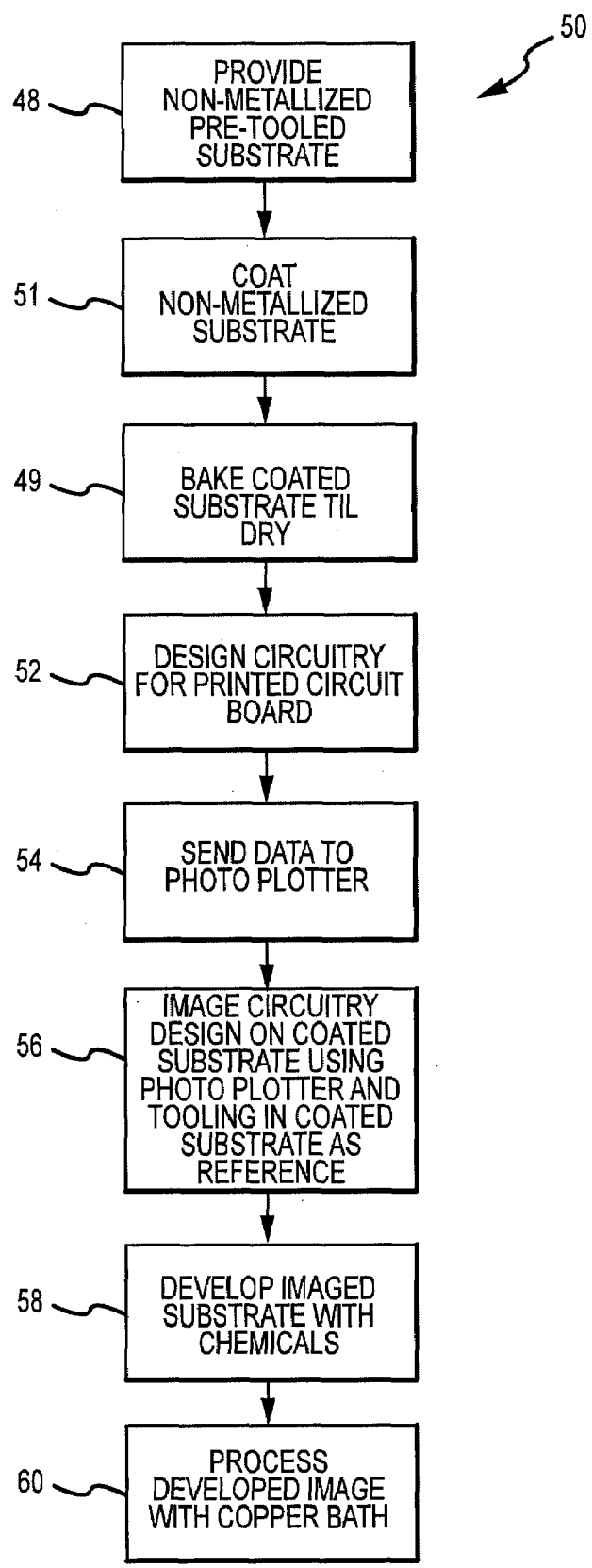
FIG. 4 is a flow chart depicting another exemplary embodiment of the method of the present invention for fabricating printed circuits and printed circuit boards.

Another, more detailed exemplary embodiment of the present invention for fabricating printed circuits and printed circuit boards is shown in FIG. 4 by flow chart 50. First, a non-metallized pre-tooled substrate is provided in step 48 which is then coated in step 51. The non-metallized pre-tooled substrate may comprise any substrate or bonding film known in the industry of printed circuit board technology as long as the substrate is flat and uniform for imaging. For example, the non-metallized substrate may be a liquid crystal polymer, a polyimide, a flat glass plate, a polyethylene terephthalate, a filled polytetrafluoroethylene, a unfilled polytetrafluoroethylene, a polytetrafluoroethylene woven glass, a polytetrafluoroethylene non woven glass, a low temperature cofired ceramic (LTCC), and a high temperature cofired ceramic (HTCC). The substrates may be woven or non woven and ceramic filled or unfilled. In addition, a number of known products may also be used as the non-metallized substrate including products known as KAPTON, SPEED BOARD C, ULTRALAM, FR4 EPOXIES, MULTIFUNCTIONAL EPOXIES, BT EPOXIES, LCP, and DUROID. The non-metallized pre-tooled substrate is coated in step 51 with a photosensitive chemical that is suitable for laser imaging. Such chemicals may include, but are not limited to, a silver nitrate based liquid, a silver chloride based with citric acid and photosensitive gelatin, an iron based material, a chrome copper based material, a chrome nickel based material, an electroless nickel, an immersion gold, a platinum based material, and palladium based material.

The coated substrate is then baked until dry in step 49. In one exemplary embodiment, the coated substrate is baked at 40 degrees Celsius in a conventional oven or a conveyor oven for approximately 20 to 30 minutes. The circuitry for the printed circuit or printed circuit board is then designed in step 52 and the data relating to the circuit design is sent to a photo plotter or laser direct imaging in step 54. Next, the circuitry design is imaged onto the coated substrate using the photo plotter or laser direct imager in step 56 and the tooling in the coated substrate is used as a reference guide during the imaging. In contrast to prior art processes, a silver halide polyester film is not used for imaging. Instead, the coated substrate is placed directly on the photo plotter or laser direct imager for imaging. As a result, the method of the present invention for fabricating printed circuits and printed circuit boards eliminates the need for a number of products, steps, and procedures including the need for silver film, diazo film, dry film, liquid dry films, collimated or non-collimated UV light sources, hot roll vacuum lamination, developing and etching and stripping of standard printed circuit boards, and waste treatment chemicals along with associated overhead and direct and indirect labor costs.

In the exemplary method shown in FIG. 4, the image substrate is then developed with chemistries in step 58. Here, chemistries such as any paper type developer like KODAK DEKTOL or NGS NAT 540 and FIXER NAT 750 may be used or EDTA based developer.

Finally, the developed image is processed in step 60 with a copper bath to create the resulting printed circuit or printed circuit board. This may include any standard electroless copper plating process used for circuit board hole metallization that is known in the art.

Figure 5:
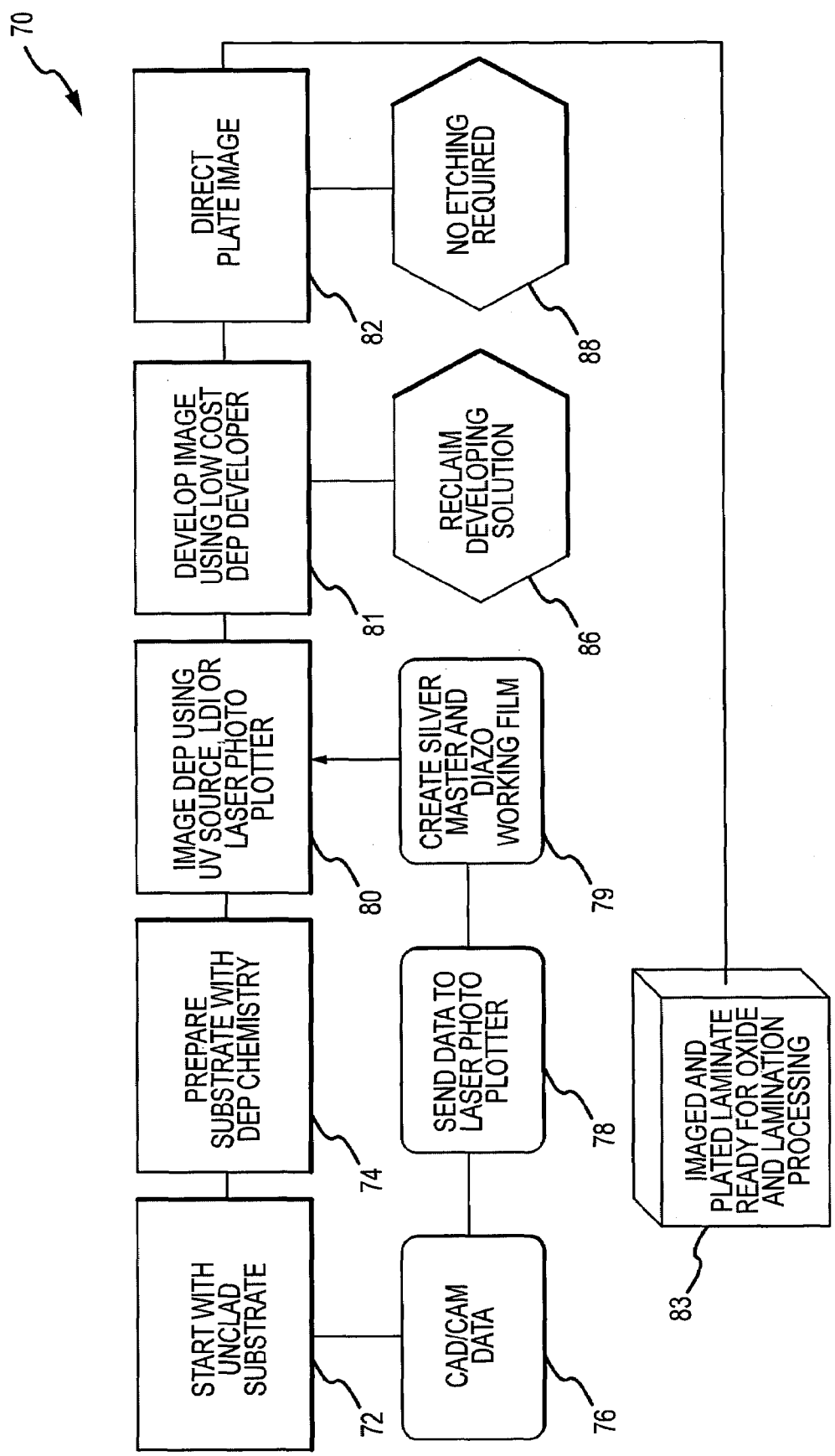
FIG. 5 is a flow chart depicting yet another exemplary embodiment of the method of the present invention for fabricating printed circuits and printed circuit boards.

A flow chart 70 depicting yet another exemplary embodiment of the method of the present invention for fabricating printed circuits and printed circuit boards is shown in FIG. 5. The process begins with an unclad substrate in step 72. The unclad substrate is then prepared with a direct emulsion process chemistry in step 74. Step 74 involves coating the unclad (or non-metallized) substrate with a solution which creates a light sensitive surface on the substrate. The solution preferably comprises a ferric oxalate and palladium emulsion or a silver based emulsion. However, the solution may also include, but is not limited to, the following: a silver nitrate based liquid, a silver chloride based with citric acid and a photosensitive gelatin, an iron based material, a chrome copper based material, a chrome nickel based material, an immersion gold material, and a platinum based material used in conjunction with palladium.

A circuit is created with a CAD/CAM design in step 76 and the data relating to the circuit design is sent to a laser photo plotter in step 78. Next, in step 79, the circuit design is photo plotted to a silver master and diazo working film. The coated substrate from step 74 is then imaged with the circuit design in step 80 by exposing the surface of the coated substrate to a light source such as, for example, an ultraviolet source, a laser photo plotter, direct collimation imaging, or laser direct imaging. Once the surface is exposed to light, the iron material from the ferric oxalate and palladium emulsion darkens or oxidizes thereby allowing the palladium particles to adhere to these exposed sites. The now exposed iron/palladium site remains and the unexposed areas are washed (developed) away leaving a darkened image on the substrate. The imaged substrate is developed with one or more chemistries in step 81 which may include a low cost developer for the direct emulsion process chemistry used in step 74. Other chemistries may also be used such as any paper type developer like KODAK DEKTOL or NGS NAT 540 and FIXER NAT 750 may be used or EDTA based developer. In step 82, the developed image is directly plated onto the substrate. Step 82 of directly plating the developed image onto the substrate may include the step of passing the developed substrate through an electroless solution to enable a metal to adhere to the developed image thereby creating a metal image on the substrate. The imaged and plated laminate is then ready for oxide and lamination processing in step 83 to create a printed circuit.

Unlike the prior art conventional process for making printed circuits described with reference to FIG. 2 above, the method for making printed circuit boards in accordance with the present invention and described with reference to FIG. 3 creates efficiencies and eliminates waste thereby reducing costs and process times for making printed circuits. For example, the developing solution (chemistry) used in step 81 can be reclaimed 86 and no etching is required 88 when the developed image is directly plated onto the substrate in step 82. Furthermore, eliminating the need for copper on the substrate and the need for dry film, dry film coating, dry film developing, etching and dry film stripping significantly reduces stress in the laminate thereby improving registration of the layers from top to bottom. This also eliminates the need for all associated costs for each of these processes and the subsequent waste disposal of any by products generated in the etching process.

Potential applications for the direct emulsion process of the present invention for making printed circuits include, but are not limited to, chip packaging, defense/aerospace including phased array and planar array antennas, high frequency components, high speed/frequency flex interconnects including board to board interconnects, medical devices including implantable medical devices, automotive, and down hole and pipeline monitoring electronics.

It will be understood that the foregoing description is of preferred exemplary embodiments of the invention and that the invention is not limited to specific forms shown or described herein. Various modifications may be made in the design, arrangement, order, and types of steps disclosed herein for making and using the invention without departing from the scope of the invention as expressed in the appended claims.

The invention claimed is

1. A direct emulsion process for making a printed circuit which consists of the steps of:
   coating a non-metallized substrate with a ferric oxalate and palladium emulsion;
   imaging the coated substrate with a predesigned circuitry by exposing the surface of the coated substrate to a light source;
   developing the imaged substrate with one or more chemistries; and
   directly plating the developed image onto the substrate to create a printed circuit having fine line images below 2 microns.

2. The direct emulsion process of claim 1 wherein the non-metallized substrate comprises at least one of a liquid crystal polymer, a polyimide, a polyethylene terephthalate, a filled polytetrafluoroethylene, an unfilled polytetrafluoroethylene, a polytetrafluoroethylene woven glass, a polytetrafluoroethylene non woven glass, a low temperature cofired ceramic, and a high temperature cofired ceramic.

3. The direct emulsion process of claim 1 wherein the step of imaging the coated substrate comprises the step of imaging the coated substrate by exposing the surface of the coated substrate to at least one of an ultraviolet light, a laser photo plotter, direct collimation imaging, and laser direct imaging.

4. The direct emulsion process of claim 1 wherein the step of directly plating the developed image onto the substrate comprises the step of passing the developed substrate through an electroless solution to enable copper to adhere to the developed image thereby creating a copper image on the substrate.

5. A direct emulsion process for making a printed circuit which consists of the steps of:
   removing metal from a metal clad substrate;
   coating the non-metallized substrate with a ferric oxalate and palladium emulsion;
   imaging the coated substrate with a predesigned circuitry by exposing the surface of the coated substrate to a light source;
   developing the imaged substrate with one or more chemistries; and
   directly plating the developed image onto the substrate to create a printed circuit having fine line images below 2 microns.

6. The direct emulsion process of claim 5 wherein the non-metallized substrate comprises at least one of a liquid crystal polymer, a polyimide, a polyethylene terephthalate, a filled polytetrafluoroethylene, an unfilled polytetrafluoroethylene, a polytetrafluoroethylene woven glass, a polytetrafluoroethylene non woven glass, a low temperature cofired ceramic, and a high temperature cofired ceramic.

7. The direct emulsion process of claim 5 wherein the step of imaging the coated substrate comprises the step of imaging the coated substrate by exposing the surface of the coated substrate to at least one of an ultraviolet light, a laser photo plotter, direct collimation imaging and laser direct imaging.

8. The direct emulsion process of claim 5 wherein the step of directly plating the developed image onto the substrate comprises the step of passing the developed substrate through an electroless solution to enable copper to adhere to the developed image thereby creating a copper image on the substrate.

* * * * *